(12) United States Patent
Brew et al.

(10) Patent No.: US 11,889,773 B2
(45) Date of Patent: *Jan. 30, 2024

(54) MULTI-LAYER PHASE CHANGE MEMORY DEVICE

(71) Applicant: International Business Machines Corporation, Armonk, NY (US)

(72) Inventors: Kevin W. Brew, Niskayuna, NY (US); Injo Ok, Loudonville, NY (US); Jin Ping Han, Yorktown Heights, NY (US); Timothy Mathew Philip, Albany, NY (US); Matthew Joseph BrightSky, Armonk, NY (US); Nicole Saulnier, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/172,385

(22) Filed: Feb. 22, 2023

(65) Prior Publication Data
US 2023/0200267 A1 Jun. 22, 2023

Related U.S. Application Data

(63) Continuation of application No. 17/136,384, filed on Dec. 29, 2020, now Pat. No. 11,621,394.

(51) Int. Cl.
*G11C 11/00* (2006.01)
*H10N 70/20* (2023.01)
(Continued)

(52) U.S. Cl.
CPC .......... *H10N 70/231* (2023.02); *G11C 11/54* (2013.01); *G11C 13/0004* (2013.01);
(Continued)

(58) Field of Classification Search
CPC .. H10N 70/826; H10N 70/8413; H10B 63/24; G11C 11/54; G11C 13/0004; G11C 2213/72; G06N 3/065
(Continued)

(56) References Cited

U.S. PATENT DOCUMENTS 7,571,901 B2 * 8/2009 Philipp .............. G11C 13/0064
365/163
7,692,959 B2 4/2010 Krusin-Elbaum
(Continued)

OTHER PUBLICATIONS

International Search Report and Written Opinion dated Jan. 27, 2022, for International Application No. PCT/CN2021/126411, filed Oct. 26, 2021.

(Continued)

*Primary Examiner* — Viet Q Nguyen
(74) *Attorney, Agent, or Firm* — Grant M. McNeilly

(57) ABSTRACT

A phase change memory (PCM) cell comprises a first electrode comprised of a first electrically conductive material, a second electrode comprised of a second electrically conductive material, a first phase change layer positioned between the first electrode and the second electrode and being comprised of a first phase change material, and a second phase change layer positioned between the first electrode and the second electrode and being comprised of a second phase change material. The first phase change material has a first resistivity, the second phase change material has a second resistivity, and wherein the first resistivity is at least two times the second resistivity.

20 Claims, 7 Drawing Sheets

(51) Int. Cl.
*G11C 11/54* (2006.01)
*G11C 13/00* (2006.01)
*H10B 63/00* (2023.01)
*H10N 70/00* (2023.01)
*G06N 3/065* (2023.01)

(52) U.S. Cl.
CPC .......... *H10B 63/24* (2023.02); *H10N 70/826* (2023.02); *H10N 70/8413* (2023.02); *G06N 3/065* (2023.01); *G11C 2213/72* (2013.01)

(58) Field of Classification Search
USPC ........................................................ 365/163
See application file for complete search history.

(56) References Cited

U.S. PATENT DOCUMENTS

| | | | | |
|---|---|---|---|---|
| 7,812,333 B2 * | 10/2010 | Philipp | ................ | H10N 70/066 365/163 |
| 7,838,860 B2 * | 11/2010 | Happ | .................. | H01L 27/1021 257/3 |
| 8,009,468 B2 * | 8/2011 | Andres | ................ | H10N 70/884 365/151 |
| 8,178,386 B2 | 5/2012 | Lung | | |
| 8,207,518 B2 * | 6/2012 | Kubo | ..................... | H10B 63/20 257/4 |
| 8,284,596 B2 * | 10/2012 | Kasko | ................ | H10N 70/826 977/754 |
| 8,648,326 B2 | 2/2014 | Breitwisch | | |
| 8,921,802 B2 * | 12/2014 | White | ....................... | H01J 3/22 250/492.21 |
| 8,921,820 B2 | 12/2014 | Brightsky | | |
| 9,111,609 B2 * | 8/2015 | Happ | ................... | H10N 70/884 |
| 9,269,570 B2 | 2/2016 | Morand | | |
| 9,293,199 B2 | 3/2016 | Krebs | | |
| 9,799,706 B2 | 10/2017 | Park | | |
| 2007/0215853 A1 * | 9/2007 | Park | .................. | H10N 70/8825 257/E47.001 |
| 2007/0267620 A1 | 11/2007 | Happ | | |
| 2008/0145702 A1 | 6/2008 | Shin et al. | | |
| 2009/0078924 A1 * | 3/2009 | Liang | ................... | H10N 70/826 257/3 |
| 2012/0127779 A1 * | 5/2012 | Scheuerlein | ......... | H10N 70/826 365/148 |
| 2014/0043893 A1 * | 2/2014 | Colombo | ........... | G11C 13/0069 216/13 |
| 2014/0367630 A1 | 12/2014 | Asano | | |
| 2017/0263863 A1 * | 9/2017 | Lung | ................... | H10N 70/231 |
| 2022/0209105 A1 | 6/2022 | Brew | | |

OTHER PUBLICATIONS

Koelmans et al., "Projected phase-change memory devices," Nature Communications, vol. 6, No. 1, Sep. 3, 2015, pp. 1-7.
List of IBM Applications to be treated as related, Feb. 17, 2023, 2 pages.
Neumann et al., "Engineering thermal and electrical interface properties of phase change memory with monolayer MoS2," Applied Physics Letters. vol. 114, No. 8, Feb. 27, 2019, 6 pages.
Ryu et al., "Phase transformation behaviors of SiO2 doped Ge2Sb2Te5 films for application in phase change random access memory," Applied Physics Letters, vol. 92, No. 14, Apr. 11, 2008, 4 pages.

* cited by examiner

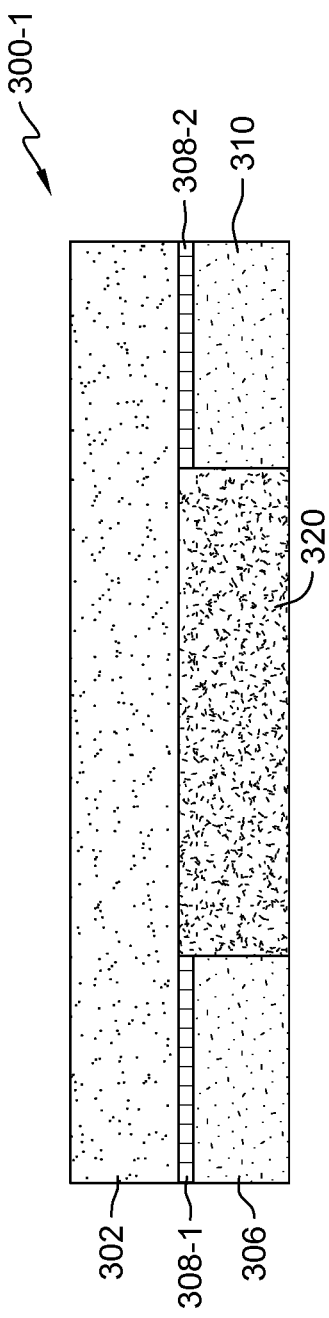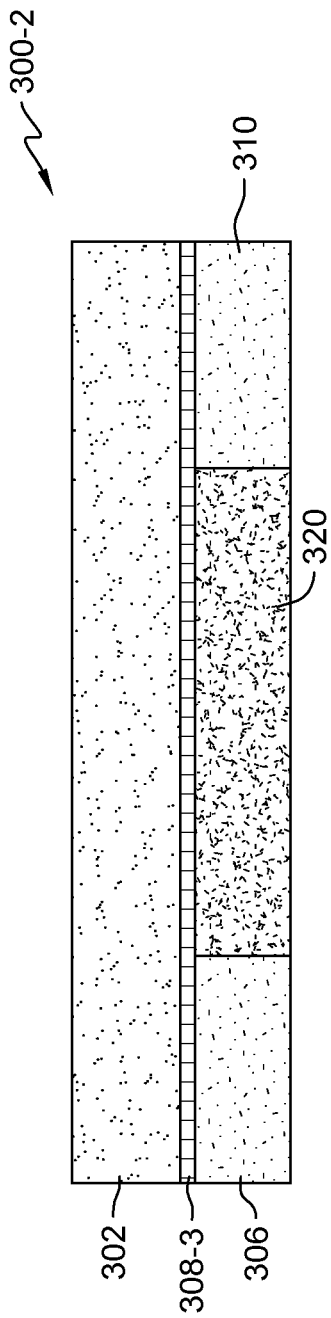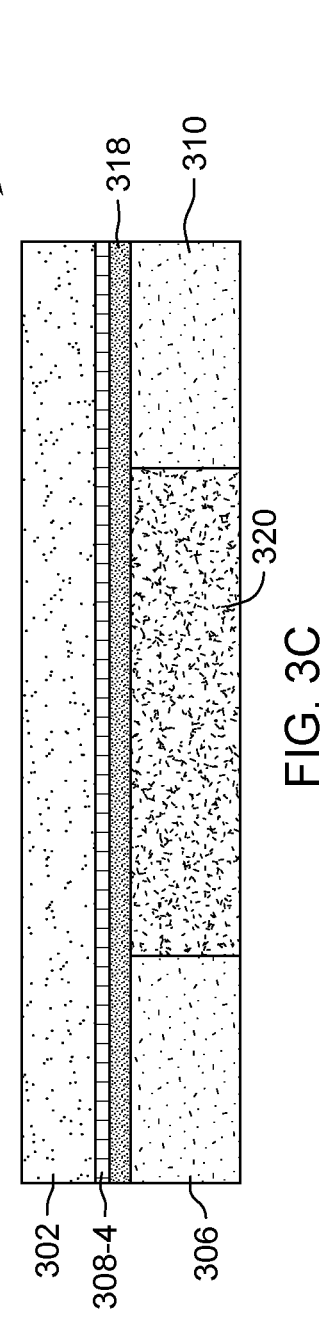

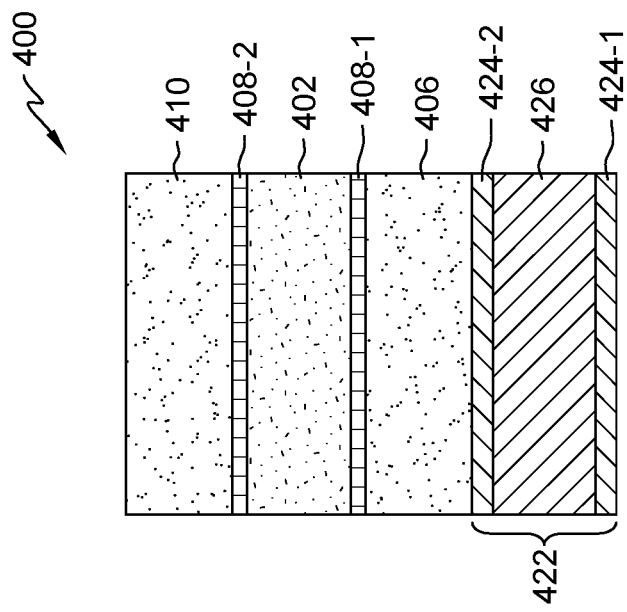

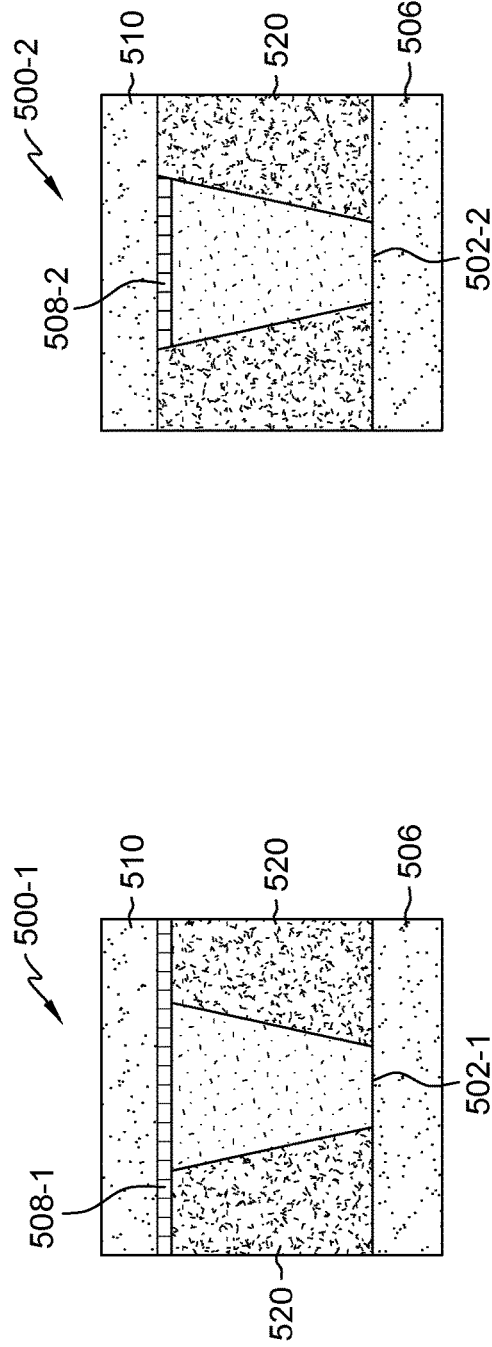
FIG. 5A
FIG. 5B
FIG. 5C
FIG. 5D

MULTI-LAYER PHASE CHANGE MEMORY DEVICE

BACKGROUND

The present invention relates to computer memory, and more specifically, to phase change material memory devices with multiple layers.

Phase change memory (PCM) can be utilized for both training and inference in analog computing for artificial intelligence. The phase change memory structures can include phase change memristive devices with tunable conductivities from device to device and overall high device resistance with high retention to minimize energy consumption. Mixing (a.k.a. doping) PCM materials with dielectrics and poorly electrically conductive materials such as, for example, silicon dioxide (SiO2), silicon monoxide (SiO), silicon oxynitride (SiON), silicon oxycarbide (SiOC), and aluminum nitride (AlN), can increase both crystallization temperature and resistivity, providing improved resistance state retention and low programming power.

SUMMARY

According to an embodiment of the present disclosure, a phase change memory (PCM) cell comprises a first electrode comprised of a first electrically conductive material, a second electrode comprised of a second electrically conductive material, a first phase change layer positioned between the first electrode and the second electrode and being comprised of a first phase change material, and a second phase change layer positioned between the first electrode and the second electrode and being comprised of a second phase change material. The first phase change material has a first resistivity, the second phase change material has a second resistivity, and wherein the first resistivity is at least two times the second resistivity.

According to an embodiment of the present disclosure, a PCM cell comprises a first electrode comprised of a first electrically conductive material, a second electrode comprised of a second electrically conductive material, and a first phase change layer positioned between the first electrode and the second electrode, the first phase change layer having a first thickness and being comprised of a first phase change material. The PCM cell further comprises a second phase change layer positioned between the first electrode and the second electrode, the second phase change layer having a second thickness and being comprised of a second phase change material, and the second thickness is less than one-quarter of the first thickness.

According to an embodiment of the present disclosure, a method of using a PCM cell comprising a first electrode, a second electrode, a doped phase change layer positioned between the first and second electrodes, and a first undoped phase change layer in contact with the doped phase change layer and one of the first and second electrodes is disclosed. The method comprises passing a first electrical current from the first electrode, through the first undoped phase change layer, to the second electrode to create a first amorphous zone in the doped phase change layer that has an amorphous configuration, measuring a first electrical resistance between the first electrode and the second electrode through the first amorphous zone, and passing a second electrical current from the first electrode, through the undoped phase change layer, to the second electrode to anneal the first amorphous zone to have a polycrystalline configuration.

According to an embodiment of the present disclosure, a PCM cell comprises a first electrode comprised of a first electrically conductive material, a second electrode comprised of a second electrically conductive material, and an insulator comprised of an electrically insulating material positioned between the first and second electrodes. The PCM cell also comprises a first phase change layer positioned alongside the first and second electrodes and the insulator, the first phase change layer being comprised of a mixture of a first phase change material and a dopant material, and the first phase change layer having a first thickness, and a second phase change layer in contact with the first phase change layer and in an electrical path between the first and second electrodes, the second phase change layer consisting essentially of a second phase change material and having a second thickness. The second thickness is less than half of the first thickness.

According to an embodiment of the present disclosure, a PCM cell, the PCM cell comprises a first electrode, a second electrode, and a pillar comprised of a mixture of a first phase change material and a dopant material, and the pillar having a first height. The PCM cell also comprises an insulator to surround the pillar, the insulator comprising an electrically insulating material, and a layer consisting essentially of a second phase change material, the layer being in contact with the pillar and extending along an entirety of a side of the pillar, the layer being in contact with at least one of the first and second electrodes, and the layer having a second height, wherein the second height is less than half of the first height.

BRIEF DESCRIPTION OF THE DRAWINGS

FIGS. 3A-3C are cross-section views of alternate embodiment bridge PCM cells, in accordance with embodiments of the present disclosure.

FIG. 4 is a cross-section view of alternate embodiment pillar PCM cell, in accordance with embodiments of the present disclosure.

FIGS. 5A-5G are cross-section views of alternate embodiment confined PCM cells, in accordance with embodiments of the present disclosure.

DETAILED DESCRIPTION

Figure 1A:
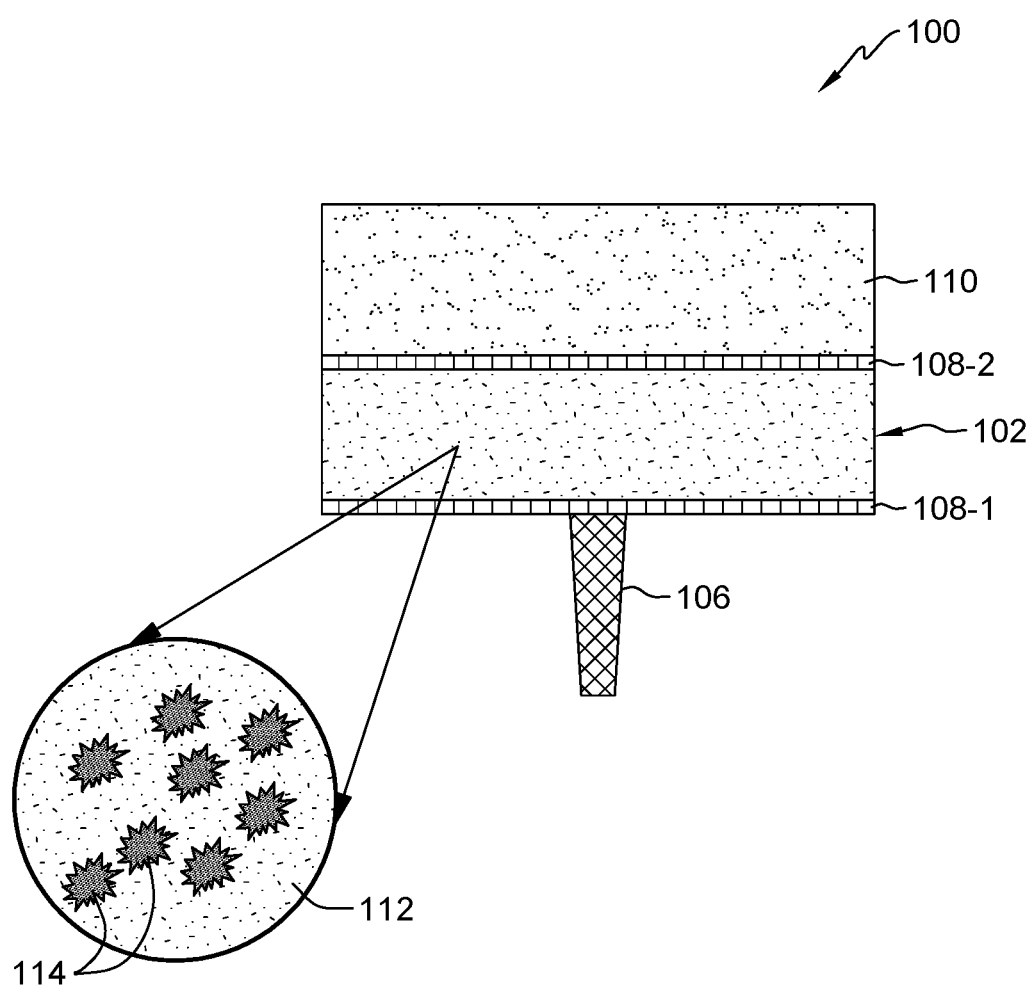
FIG. 1A is a cross-section view of a mushroom PCM cell with a doped layer in a polycrystalline configuration, in accordance with embodiments of the present disclosure.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition can be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching can be any process that removes material from the wafer. Examples include etch processes (either wet or dry), chemical mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping can be the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography can be the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Figure 1B:
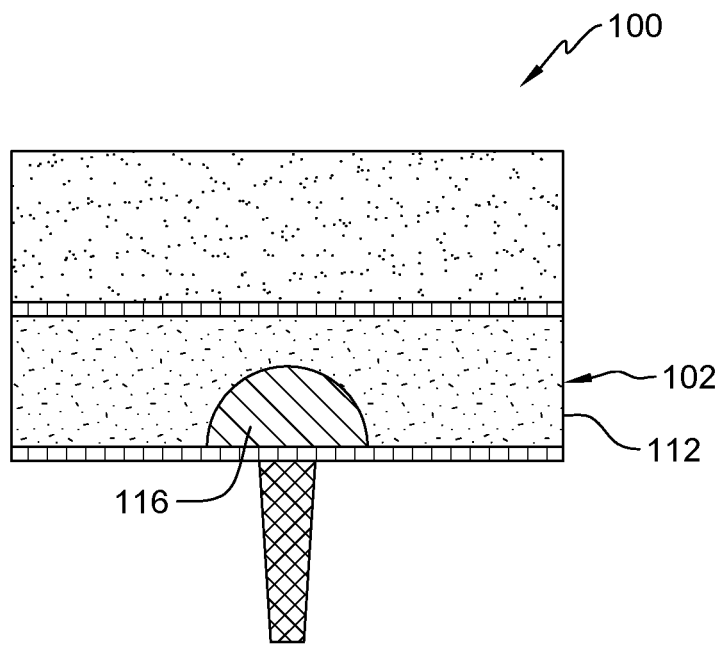
FIG. 1B is a cross-section view of the mushroom PCM cell with the doped phase change material layer including an amorphized portion of the doped phase change layer, in accordance with embodiments of the present disclosure.
Figure 1C:
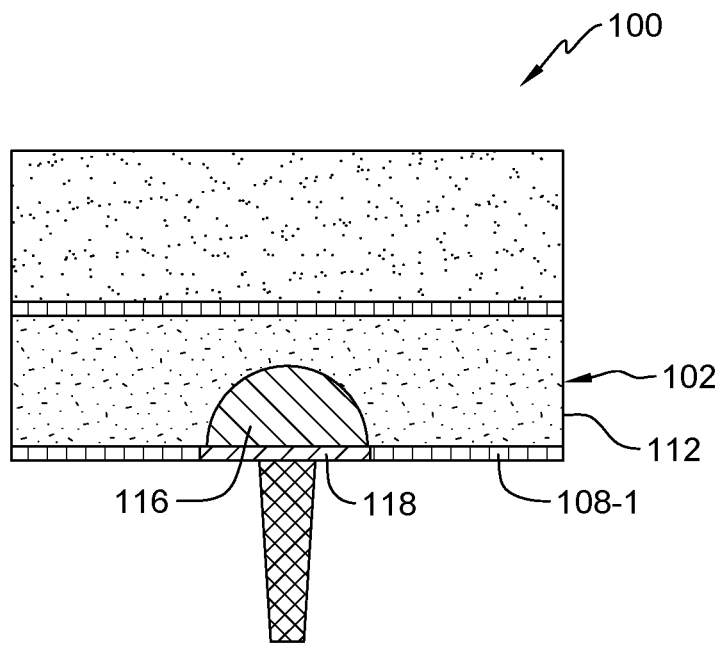
FIG. 1C is a cross-section view of the mushroom PCM cell with the doped phase change material layer including an amorphized portion of the doped phase change layer and an undoped phase change material layer including an amorphized portion of the undoped phase change layer, in accordance with embodiments of the present disclosure.

FIG. 1A is a cross-section view of PCM cell 100 with doped layer 102 in a polycrystalline configuration. FIG. 1B is a cross-section view of PCM cell 100 with doped layer 102 including zone 116 with an amorphous configuration. FIG. 1C is a cross-section view of PCM cell 100 with doped layer 102 including zone 116 with an amorphous configuration and undoped layer 108-1 including zone 118 with an amorphous configuration. FIGS. 1A-1C will now be discussed in conjunction with one another.

In the illustrated embodiment, PCM cell 100 comprises heater 106, undoped layer 108-1 in contact with bottom electrode heater 106, doped layer 102 in contact with undoped layer 108-1, undoped layer 108-2 in contact with doped layer 102, and electrode 110 in contact with undoped layer 108-2. The widths of undoped layer 108-1, doped layer 102, undoped layer 108-2, and electrode 110 are the same, whereas the width of heater 106 is substantially reduced, comparatively. Thereby, PCM cell 100 can be said to have a mushroom configuration wherein an electrical current can flow from heater 106 to electrode 110 through undoped layer 108-1, doped layer 102, and undoped layer 108-2.

Heater 106 and electrode 110 can be comprised of an electrically conductive material, such as metal, for example, titanium nitride (TiN). Heater 106 is an electrode that has a relatively narrow cross-sectional area, which focuses electrical current that is run through PCM cell 100. This allows heater 106 to generate heat through resistive heating, which can be used to change the temperature of PCM cell 100 (e.g., undoped layer 108-1 and doped layer 102), for example, above the crystallization temperature and the melting temperature of doped layer 102. In addition, heater 106 can be comprised of multiple different electrically conductive materials that can be arranged in multiple layers.

Undoped layers 108-1 and 108-2 (collectively, undoped layers 108) can be composed essentially of a phase change material such as a germanium-antimony-tellurium (GST) gallium-antimony-tellurium (GaST), or silver-iridium-antimony-telluride (AIST) material, although other materials can be used as appropriate. In addition, the phase change material of undoped layers 108-1 and 108-2 are the same in some embodiments, and they are different is other embodiments. The terms "composed essentially" and "consist essentially," as used herein with respect to materials of different layers, indicates that other materials, if present, do not materially alter the basic characteristics of the recited materials. For example, a layer consisting essentially of GST material does not include other materials that materially alter the basic characteristics of the GST material. Hence, layers 108-1 and 108-2 are also referred to as undoped layers. On the other hand, doped layer 102 can be a mixture of phase change material 112 and phase separated dopant material 114. Doped layer 102 can also be a substitutional or interstitial doped phase change material such as, for example, titanium-GST (TiGST), gallium-GST (GaGST), silicon-GST (SiGST), or bismuth-GST (BiGST), since these atoms can substitute/sit on interstices due to their solubility in GST. Phase change material 112 can be a GST material (although other materials can be used as appropriate which may be the same as or different than undoped layers 108). Phase separated dopant material 114 can be one or more dielectric materials or poorly-electrically conductive metals, such as $SiO_2$, SiO, SiON, SiOC, carbon (C), tantalum nitride ($Ta_3N_5$), aluminum nitride (AlN), and titanium nitride (TiN) although other materials can be used as appropriate. The grains of phase separated dopant material 114 can restrict the grain size of phase change material 112 and provide "nano opens" (i.e., local regions of relatively high electrical resistance) to increase the resistance of doped layer 102, and, in some embodiments, the amount of phase separated dopant material 114 in doped layer 102 is at least 10% by volume.

In the illustrated embodiment, undoped layers 108 are substantially thinner (in height) than doped layer 102. In addition, the thicknesses of undoped layers 108-1 and 108-2 are the same in some embodiments, and they are different is other embodiments. In some embodiments, the thickness of undoped layers 108 is less than half of the thickness of doped layer 102. In some embodiments, the thickness of undoped layers 108 is less than one eighth of the thickness of doped layer 102. In some embodiments, the thickness of undoped layers 108 is less than one sixteenth of the thickness of doped layer 102. In some embodiments, the thickness of undoped layers 108 is less than one eightieth of the thickness of doped layer 102. In some embodiments, the thickness of undoped layers 108 is between 0.2 nanometers (nm) and 10 nm, and the thickness of doped layer 102 is between 20 nm and 100 nm. In some embodiments, the thickness of undoped layers 108 is between 0.5 nm and 5 nm, and the thickness of doped layer 102 is between 40 nm and 80 nm.

In some embodiments, a cross-section of PCM cell 100 (into the page in FIGS. 1A and 1B) can be square, although in other embodiments, it can be rectangular or circular. In some embodiments, the width or diameter of heater 106 can be between 20 nm and 60 nm. In some embodiments, the width or diameter of heater 106 can be about 40 nm. In some embodiments, the width or diameter of doped layer 102, undoped layers 108, and electrode 110 can be between 100 nm and 300 nm. In some embodiments, the width or diameter of doped layer 102, undoped layers 108, and electrode 110 can be about 200 nm. In some embodiments, the width or diameter of doped layer 102, undoped layers 108, and electrode 110 can be greater than 200 nm.

In the illustrated embodiment, PCM cell 100 can be operated as a memory cell by passing an electrical current from heater 106 to electrode 110. This can be done at a variety of voltages to read or write a value on PCM cell 100. For example, to write, a high voltage can be used (e.g., 1 volt (V) to 4 V) for a short period of time, which can cause heater 106 to heat doped layer 102 beyond its melting point. Once the flow of current ceases, doped layer 102 can cool down rapidly, which forms zone 116 in a process called "resetting". Zone 116 is a dome-shaped region of doped layer 102 wherein phase change material 112 inside zone 116 is in an amorphous configuration, although the phase change material 112 outside of zone 116 is still in a polycrystalline configuration. In addition, a similar "reset" zone 118 can be formed in undoped layer 108-1, depending on the voltage, current, and/or duration of the resetting electrical pulse. Furthermore, the diameter of zone 118 can be larger than, the same as, or smaller than zone 116 (although it is depicted as being larger in FIG. 1C). In general, this amorphous configuration has no definite structure. However, there can be local, disjoint crystalline nuclei (i.e., small crystallized regions of phase change material 112) present in zone 116 and/or zone 118.

In some embodiments, zone 116 can be 40 nm tall and 40 nm in diameter. The creation of zone 116 can cause the electrical resistance across PCM cell 100 to increase as compared to a solely polycrystalline configuration of doped layer 102 (à la FIG. 1A). This new resistance value can then be read using current at a low voltage (e.g., 0.2 V) without changing the resistance value.

In addition, to again write PCM cell 100, phase change material 112 can be returned back to a solely polycrystalline configuration by "setting" PCM cell 100. A high voltage can be used (e.g., 1 V to 4 V) for a short period of time (e.g., 10 nanoseconds (ns)), which can cause heater 106 to heat doped layer 102 beyond its crystallization point but not to its melting point. Since the crystallization temperature is lower than the melting temperature, once the flow of current ceases, doped layer 102 can anneal and form crystals. This can cause the electrical resistance across PCM cell 100 to decrease as compared to having an amorphous zone 116 (à la FIG. 1B) and/or zone 118 (à la FIG. 1C). This new resistance value can then be read using current at a low voltage (e.g., 0.2 V) without changing the resistance value.

In some embodiments, the melting temperature of undoped layers 108 and doped layer 102 (i.e., the melting temperature of phase change material 112 and phase change material 112 with phase separated dopant material 114) can be about 600° C. In some embodiments, the crystallization temperature of doped layer 102 can be about 220° C., for example, if phase separated dopant material 114 is SiO2. In some embodiments, the crystallization temperature of undoped layers 108 can be about 180° C. In addition, the process of setting and resetting PCM cell 100 can occur repeatedly, and in some embodiments, various zones 116 with different resistances can be created in doped layer 102 (e.g., due to having different sizes and amounts of crystallization nuclei in zone 116). This allows for PCM cell 100 to be non-binary in that various distinct resistances can be created by varying the resetting parameters.

The ability to set and reset doped layer 102 can be facilitated by including undoped layers 108 between doped layer 102 and heater 106/electrode 110. More specifically, phase separated dopant material 114 in doped layer 102 can minimize the time and voltage conditions over which phase change material 112 can be electrically crystalized. Thereby, undoped layers 108 can function as transitions between the low resistance of heater 106/electrode 110 and the high resistance of doped layer 102, allowing electrical current to spread over a larger area than that of the upper surface of heater 106. Undoped layers 108 can have better ohmic contact with heater 106/electrode 110 than doped layer 102 would, and there is less variance in the low resistance states of undoped layer 108-1 due to homogenous contact with heater 106. In addition, undoped layers 108 can homogenize the areas of ohmic contact with doped layer 102 and heater 106/electrode 110, reducing the low resistance state variance.

The components and configuration of PCM cell 100 provide analog computing capabilities. For example, the variable resistance of PCM cell 100 can be set to correspond to values of analog weights. Instead of mere 1's and 0's associated with a high and a low resistance state suitable for binary computing, these weights can exist on a continuum of analog resistance values and can be used as artificial synapse weights in a neural net for artificial intelligence computations and machine learning. The relatively thin undoped layers 108 positioned between heater 106/electrode 110 and doped layer 102 widens the voltage range that can be used to set and reset PCM cell 100. This can be important if doped layer 102 has a high amount of doping because otherwise PCM cell 100 may not be able to be set after being reset for the first time. Furthermore, the wider voltage range increases the range of operation of the memory programming function of PCM cell 100, which can allow for a tighter distribution of resistance states leading to a more reliable operation of PCM cell 100.

Depicted in FIGS. 1A-1C is one embodiment of the present disclosure, to which there are alternatives. For example, doped layer 102 can be replaced by another undoped layer that is as thick as doped layer 102. In such embodiments, the thick undoped layer can be a different material than the thin undoped layers 108 that has a substantially higher electrical resistivity. In some embodiments, if undoped layers 108 consist essentially of antimony telluride (Sb2Te3), then the thick undoped layer can consist essentially of GST225 (i.e., Ge2Sb2Te5). When crystalline, Sb2Te3 has a resistivity of about 0.0005 ohm*cm, whereas GST225 has a resistivity of about 0.003 ohm*cm. This is in contrast to a doped layer 102, which can have a resistivity of about 1 ohm*cm when crystalline, which can be used with undoped layers 108 consisting essentially of GST225. While the resistivities of doped layer 102/thick undoped layer and undoped layers 108 can change with changing crystalline or amorphous structure, generally, the resistivity of the thick undoped layer can be between 2 and 1000 times greater than the resistivity of undoped layers 108. In some embodiments, the resistivity of the thick undoped layer can be between 8 and 750 times greater than the resistivity of undoped layers 108, and in some embodiments, the resistivity of the thick undoped layer can be between 10 and 500 times greater than the resistivity of undoped layers 108.

For another example, one or both of undoped layers 108 can be replaced by another doped layer that is as thin as undoped layers 108, respectively. In such embodiments, the thin doped layer can be a different material than the thick doped layer 102 that has a substantially lower electrical resistivity. Dopants that result in lower resistivities can include, for example, titanium (Ti), bismuth (Bi), indium (In), and silver (Ag). These dopants are in contrast to dopants that result in higher resistivities such as, for example, SiO2, SiO, SiON, SiOC, C, Ta3N5, AlN, and TiN. Therefore, in some embodiments, if doped layer 102 comprises SiO2:GST, then thin doped layers can comprise TiGST.

FIGS. 2A-2F are cross-section views of alternate embodiment PCM cells 200A-200E (collectively, PCM cells 200), respectively. PCM cells 200 can be similar to or the same as PCM cell 100 (shown in FIG. 1) in certain aspects. Therefore, some of these aspects may have reference numerals that are one hundred greater than those of PCM cell 100.

Figures 2A, 2B, 2C, 2D, 2E, 2F:
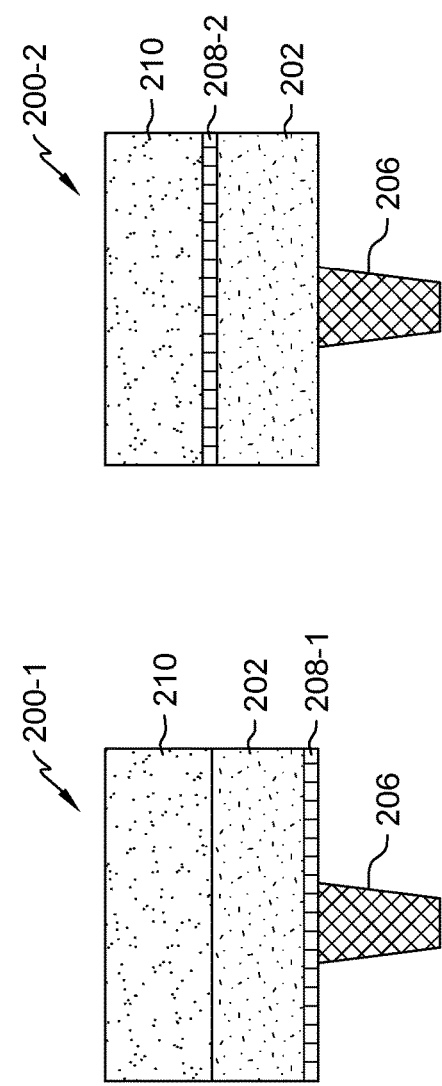
FIGS. 2A-2F are cross-section views of alternate embodiment mushroom PCM cells, in accordance with embodiments of the present disclosure.

In the illustrated embodiment of FIG. 2A, PCM cell 200-1 includes a single, thin undoped layer 208-1 positioned between heater 206 and doped layer 202. In the illustrated embodiment of FIG. 2B, PCM cell 200-2 includes a single, thin undoped layer 208-2 positioned between doped layer 202 and electrode 210. While PCM cells 200-1 and 200-2 have fewer undoped layers than PCM cell 100 has, the function and purpose of undoped layers 208-1 and 208-2 can be the same as that of undoped layers 108.

In the illustrated embodiment of FIG. 2C, PCM cell 200-3 includes projection liner 218-1 positioned between heater 206 and undoped layer 208-3, and undoped layer 208-3 is also in contact with doped layer 202. In the illustrated embodiment of FIG. 2D, PCM cell 200-4 includes projection liner 218-2 positioned between heater 206 and doped layer 202, and undoped layer 208-4 is positioned between doped layer 202 and electrode 210. In the illustrated embodiment of FIG. 2E, PCM cell 200-5 includes projection liner 218-3 positioned between heater 206 and undoped layer 208-5, and undoped layer 208-5 is also in contact with doped layer 202. Furthermore, PCM cell 200-5 includes a second undoped layer 208-6 positioned between doped layer 202 and electrode 210. In the illustrated embodiment of FIG. 2F, PCM cell 200-6 includes undoped layer 208-7 positioned between heater 206 and projection liner 218-4, and projection liner 218-4 is also in contact with doped layer 202.

Projection liners 218-1, 218-2, and 218-3 (collectively, projection liners 218) can extend across the full width of undoped layer 208-3, doped layer 202, and undoped layer 208-5, respectively. Projection liners 218 can be comprised of metal and/or semiconducting material. Thereby, projection liners 218 can provide a constant amount of electrical resistance and create a parallel current path around zone 116 (shown in FIG. 1) when PCM cells 200-3, 200-4, and 200-5 are reset.

FIGS. 3A-3C are cross-section views of alternate embodiment PCM cells 300-1, 300-2, and 300-3 (collectively, PCM cells 300), respectively. PCM cells 300 can be similar to or the same as PCM cells 100 (shown in FIGS. 1A and 1B) or 200 (shown in FIGS. 2A-2E) in certain aspects. Therefore, some of these aspects may have reference numerals that are two hundred greater than those of PCM cell 100 or one hundred greater than those of PCM cells 200.

In the illustrated embodiment of FIG. 3A, PCM cell 300-1 includes electrodes 306 and 310 with insulator 320 positioned in between and coplanar with electrodes 306 and 310. Insulator 320 can be comprised of an electrically insulating material such as, for example, a low-dielectric constant material, SiO2, silicon nitride (SiN), and fluorinated tetraethyl orthosilicate (FTEOS). In addition, undoped layer 308-1 extends across the entire width of the top of electrode 306, and undoped layer 308-2 extends across the entire width of the top of electrode 310. Extending alongside the entire length of undoped layers 308-1 and 308-2 (collectively undoped layers 308) and insulator 320 is doped layer 302.

When current is run through PCM cell 300-1, it travels from electrode 306 to electrode 310 through undoped layer 308-1, doped layer 302, and undoped layer 308-2. Therefore, PCM cell 300-1 has a bridge configuration. Similar to PCM cell 100 (shown in FIGS. 1A and 1B), undoped layers 308 are thin compared to the thickness of doped layer 302, which can have the same proportions and/or dimensions as those of PCM cell 100. In some embodiments, doped layer 302 is between 5 nm and 30 nm tall. In some embodiments, PCM cell 300-1 is between 100 nm and 800 nm deep (i.e., the dimension going into the page in FIG. 2A). However, in some embodiments, doped layer 302 has a dog bone or bowtie shape that has a reduced depth of between 10 nm and 50 nm in the center. While PCM cell 300-1 has a different configuration of undoped layers 308 than PCM cell 100 has, the function and purpose of undoped layers 308 can be the same as that of undoped layers 108.

In the illustrated embodiment of FIG. 3B, PCM cell 300-2 includes a single, thin undoped layer 308-3 that extends across the entire length of electrodes 306 and 310 and insulator 320. Thereby, doped layer 302 extends along the entire length of undoped layer 308-3. When current is run through PCM cell 300-2, it travels from electrode 306 to electrode 310 though undoped layer 308-3 and doped layer 302 (whereby the current that travels though doped layer 302 will cross through undoped layer 308-3 twice).

In the illustrated embodiment of FIG. 3C, PCM cell 300-3 includes projection liner 318 that extends across the entire length of electrodes 306 and 310 and insulator 320. Thereby, undoped layer 308-4 extends along the entire length of projection liner 318, and doped layer 302 extends along the entire length of undoped layer 308-4. When current is run through PCM cell 300-2, it travels from electrode 306 to electrode 310 though projection liner 318, undoped layer 308-4, and doped layer 302 (whereby the current that travels though undoped layer 308-4 will cross through projection liner 318 twice, and the current that travels though doped layer 302 will cross through undoped layer 308-4 and projection liner 318 twice). While PCM cell 300-3 has a different configuration of projection liner 318 than PCM cells 200-3, 200-4, and 200-5 have, the function and purpose of projection liner 318 can be the same as that of projection liners 218.

FIG. 4 is a cross-section view of alternate embodiment PCM cell 400. PCM cell 400 can be similar to or the same as PCM cells 100 (shown in FIGS. 1A and 1B), 200 (shown in FIGS. 2A-2E), or 300 (shown in FIGS. 3A-3C) in certain aspects. Therefore, some of these aspects may have reference numerals that are three hundred greater than those of PCM cell 100, two hundred greater than those of PCM cells 200, and one hundred greater than those of PCM cells 300.

In the illustrated embodiment, each of electrode 406, undoped layer 408-1, doped layer 402, undoped layer 408-2, and electrode 410 has the same diameter (e.g., about 40 nm). Therefore, PCM cell 400 has a pillar configuration. PCM cell 400 can be made by forming (e.g., depositing) each layer (i.e., electrode 406, undoped layer 408-1, doped layer 402, undoped layer 408-2, and electrode 410) and etching them into a pillar.

In addition, PCM cell 400 includes selector 422 beneath electrode 406. Selector 422 comprises carbon layer 424-1, ovonic threshold switch layer 426 in contact with carbon layer 424-1, and carbon layer 424-2 in contact with ovonic threshold switch layer 426 and electrode 406. However, a person having ordinary skill in the art would recognize that there are other selectors that could be employed in PCM cell 400 besides selector 422.

FIGS. 5A-5G are cross-section views of alternate embodiment PCM cells 500-1, 500-2, 500-3, 500-4, 500-5, 500-6, and 500-7 (collectively, PCM cells 500). PCM cells 500 can be similar to or the same as PCM cells 100 (shown in FIGS. 1A and 1B), 200 (shown in FIGS. 2A-2E), 300 (shown in FIGS. 3A-3C), or 400 (shown in FIG. 4) in certain aspects. Therefore, some of these aspects may have reference numerals that are four hundred greater than those of PCM cell 100, three hundred greater than those of PCM cells 200, two hundred greater than those of PCM cells 300, or one hundred greater than those of PCM cell 400.

In the illustrated embodiment of FIG. 5A, PCM cell 500-1 comprises electrode 506, doped layer 502-1, undoped layer 508-1, electrode 510, and insulator 520. Doped layer 502-1 is substantially narrower than electrode 506 and undoped layer 508-1, so insulator 520 is positioned to occupy the space around doped layer 502-1 within the projection of electrode 506 and undoped layer 508-1. Therefore, PCM cell 500-1 has a confined pillar configuration.

Unlike PCM cell 400 (shown in FIG. 4), PCM cell 500-1 can be made by forming (e.g., depositing) electrode 506 and insulator 520. Then, a pore or via channel (i.e., a blind hole) can be formed (e.g., etched) in insulator 520, and doped layer 502-1 can be formed (e.g., deposited and polished) therein. Then, undoped layer 508-1 can be formed (e.g., deposited) on top of doped layer 502-1 and insulator 520. Then, electrode 510 can be formed (e.g., deposited) on top of undoped layer 508-1.

In the illustrated embodiment of FIG. 5B, PCM cell 500-2 includes a shorter undoped layer 508-2 compared to undoped layer 508-1. However, the function and purpose undoped layer 508-2 can be the same given that undoped layer 508-2 extends across the entire top of doped layer 502-2. Since doped layer 502-2 is surrounded by insulator 520, current passed from electrode 506 to electrode 510 will still pass though undoped layer 508-2.

In the illustrated embodiment of FIG. 5C, PCM cell 500-3 includes a short undoped layer 508-3 at the bottom of doped layer 502-3. Therefore, PCM cell 500-3 can be made by forming (e.g., depositing) electrode 506 and insulator 520. Then, a pore or via channel can be formed (e.g., etched) in insulator 520, and undoped layer 508-3 can be formed (e.g., deposited) therein. Then, doped layer 502-3 can be formed (e.g., deposited and polished) on top of undoped layer 508-3. Then, electrode 510 can be formed (e.g., deposited) on top of doped layer 502-3 and insulator 520.

In the illustrated embodiment of FIG. 5D, PCM cell 500-4 includes a full width undoped layer 508-4 underneath doped layer 502-4. Therefore, PCM cell 500-4 can be made by forming (e.g., depositing) electrode 506, undoped layer 508-4, and insulator 520. Then, a pore or via channel can be formed (e.g., etched) in insulator 520 that extends down to undoped layer 508-4. Then doped layer 502-4 can be formed (e.g., deposited and polished) on top of undoped layer 508-4. Then, electrode 510 can be formed (e.g., deposited) on top of doped layer 502-4 and insulator 520.

Figure 5G:
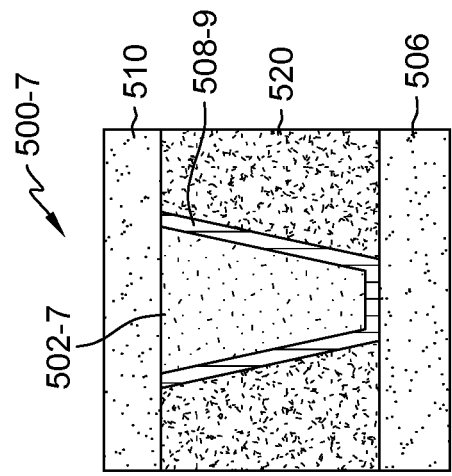
Figure 5F:
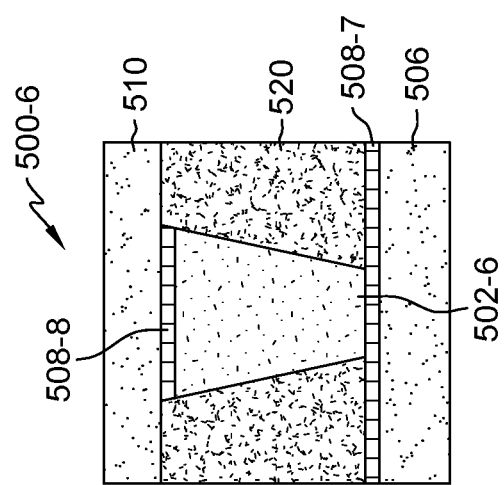
Figure 5E:
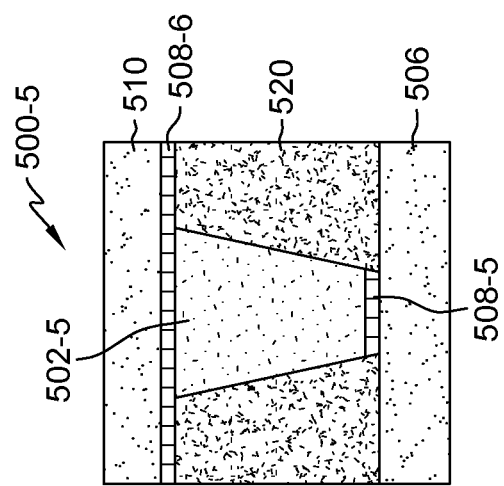

In the illustrated embodiment of FIG. 5E, PCM cell 500-5 includes two undoped layers 508-5 and 508-6 on either end of doped layer 502-5. Undoped layer 508-5 is only the width of doped layer 502-5, but undoped layer 508-6 is the full width of electrode 510. In the illustrated embodiment of FIG. 5F, PCM cell 500-6 includes two undoped layers 508-7 and 508-8 on either end of doped layer 502-6. Undoped layer 508-7 is the full width of electrode 506, but undoped layer 508-8 is only the width of doped layer 502-6. In the illustrated embodiment of FIG. 5G, PCM cell 500-7 includes undoped layer 508-9 that extends along the sides and bottom of doped layer 502-6.

Further Discussion of Some Exemplary Embodiments

The following are non-exclusive descriptions of some exemplary embodiments of the present disclosure.

A PCM cell, according to an exemplary embodiment of this disclosure, among other possible things, includes: a first electrode comprised of a first electrically conductive material; a second electrode comprised of a second electrically conductive material; a first phase change layer positioned between the first electrode and the second electrode and being comprised of a first phase change material; and a second phase change layer positioned between the first electrode and the second electrode and being comprised of a second phase change material; wherein the first phase change material has a first resistivity; wherein the second phase change material has a second resistivity; and wherein the first resistivity is at least two times the second resistivity.

The PCM cell of the preceding paragraph can optionally include, additionally and/or alternatively, any one or more of the following features, configurations, and/or additional components:

A further embodiment of the foregoing PCM cell, further comprising: a third phase change layer in contact with the first phase change layer and the second electrode, the third phase change layer comprised of a third phase change material; wherein the third phase change material has a third resistivity; and wherein the first resistivity is at least two times the third resistivity.

A further embodiment of any of the foregoing PCM cells, wherein: the third phase change layer further comprises a dopant material.

A further embodiment of any of the foregoing PCM cells, wherein: the first phase change layer further comprises a dopant material.

A further embodiment of any of the foregoing PCM cells, wherein: the second phase change layer is composed of the second phase change material.

A further embodiment of any of the foregoing PCM cells, wherein: the second phase change layer is in contact with the first electrode and the second electrode.

A further embodiment of any of the foregoing PCM cells, further comprising: a projection liner positioned between the first electrode and the second electrode and being comprised of a semiconducting material.

A further embodiment of any of the foregoing PCM cells, wherein: the projection liner is in contact with the first electrode and the second phase change layer.

A PCM cell, according to an exemplary embodiment of this disclosure, among other possible things, includes: a first electrode comprised of a first electrically conductive material; a second electrode comprised of a second electrically conductive material; a first phase change layer positioned between the first electrode and the second electrode, the first phase change layer having a first thickness and being comprised of a first phase change material; and a second phase change layer positioned between the first electrode and the second electrode, the second phase change layer having a second thickness and being comprised of a second phase change material; wherein the second thickness is less than one-quarter of the first thickness.

The PCM cell of the preceding paragraph can optionally include, additionally and/or alternatively, any one or more of the following features, configurations, and/or additional components:

A further embodiment of the foregoing PCM cell, further comprising: a third phase change layer in contact with the first phase change layer and the second electrode, the third phase change layer having a third thickness and being comprised of a third phase change material; wherein the third thickness is less than one-quarter of the first thickness.

A further embodiment of any of the foregoing PCM cells, wherein: the third phase change layer further comprises a dopant material.

A further embodiment of any of the foregoing PCM cells, wherein: the first phase change layer further comprises a dopant material.

A further embodiment of any of the foregoing PCM cells, wherein: the second phase change layer is composed essentially of the second phase change material that is undoped.

A further embodiment of any of the foregoing PCM cells, wherein: the first phase change layer has a first resistivity; the second phase change layer has a second resistivity; and the first resistivity is at least two times the second resistivity.

A further embodiment of any of the foregoing PCM cells, wherein: the second phase change layer is in contact with the first electrode and the second electrode.

A further embodiment of any of the foregoing PCM cells, further comprising: a projection liner positioned between the first electrode and the second electrode and being comprised of a semiconducting material.

A further embodiment of any of the foregoing PCM cells, wherein: the projection liner is in contact with the first electrode and the second phase change layer.

A PCM cell, according to an exemplary embodiment of this disclosure, among other possible things, includes: a first electrode comprised of a first electrically conductive material; a second electrode comprised of a second electrically conductive material; a first phase change layer comprised of a mixture of a first phase change material and a dopant material, the first phase change layer having a first thickness; and a second phase change layer in contact with the first phase change layer and only one of the first electrode and the second electrode, the second phase change layer having a second thickness and being composed essentially of a second phase change material that is undoped; wherein the second thickness is less than half of the first thickness.

The PCM cell of the preceding paragraph can optionally include, additionally and/or alternatively, any one or more of the following features, configurations, and/or additional components:

A further embodiment of the foregoing PCM cell, wherein: the second phase change layer is in contact with the first phase change layer and the first electrode; the PCM cell further comprises a third phase change layer in contact with the first phase change layer and the second electrode, the third phase change layer having a third thickness and being comprised of a third phase change material that is undoped; and the third thickness is less than half of the first thickness.

A further embodiment of any of the foregoing PCM cells, wherein the dopant material is a dielectric material.

A further embodiment of any of the foregoing PCM cells, wherein the dopant material is selected from a group consisting of: titanium, gallium, silicon, and nitrogen.

A further embodiment of any of the foregoing PCM cells, wherein the second phase change material consists essentially of germanium, antimony, and tellurium.

A further embodiment of any of the foregoing PCM cells, wherein the first electrode, the second electrode, the first phase change layer, and the second phase change layer form a column with a constant cross-sectional area.

A further embodiment of any of the foregoing PCM cells, further comprising: a selector connected to the first electrode, the selector comprising an ovonic threshold switch.

A method of using a PCM cell, according to an exemplary embodiment of this disclosure, among other possible things, includes: a first electrode, a second electrode, a doped phase change layer positioned between the first and second electrodes, and a first undoped phase change layer in contact with the doped phase change layer and one of the first and second electrodes, the method, according to an exemplary embodiment of this disclosure, among other possible things, includes: passing a first electrical current from the first electrode, through the first undoped phase change layer, to the second electrode to create a first amorphous zone in the doped phase change layer that has an amorphous configuration; measuring a first electrical resistance between the first electrode and the second electrode through the first amorphous zone; and passing a second electrical current from the first electrode, through the undoped phase change layer, to the second electrode to anneal the first amorphous zone to have a polycrystalline configuration.

The method of the preceding paragraph can optionally include, additionally and/or alternatively, any one or more of the following features, configurations, and/or additional components:

A further embodiment of the foregoing method, further comprising: measuring a second electrical resistance between the first electrode and the second electrode after annealing of the first amorphous zone; wherein the second electrical resistance is less than the first electrical resistance.

A further embodiment of any of the foregoing methods, further comprising: passing a third electrical current from the first electrode, through the first undoped phase change layer, to the second electrode to create a second amorphous zone in the doped phase change layer that has an amorphous configuration.

A further embodiment of any of the foregoing methods, wherein the first electrical current passes through the first undoped phase change layer first and the doped phase change layer second.

A further embodiment of any of the foregoing methods, wherein: the PCM cell further comprises a second undoped phase change layer in contact with the doped phase change layer; and the first electrical current passes through the first undoped phase change layer first, the doped phase change layer second, and the second undoped phase change layer third.

A PCM cell, according to an exemplary embodiment of this disclosure, among other possible things, includes: a first electrode comprised of a first electrically conductive material and having a first width; a second electrode comprised of a second electrically conductive material and having a second width; a first phase change layer comprised of a mixture of a first phase change material and a dopant material, the first phase change layer having a first thickness; and a second phase change layer positioned between the first phase change layer and one of the first electrode and the second electrode, the second phase change layer composed essentially of a second phase change material and having a second thickness; wherein the first electrode is configured to heat the first phase change layer to a temperature that is at least above a crystallization temperature of the first phase change material.

The PCM cell of the preceding paragraph can optionally include, additionally and/or alternatively, any one or more of the following features, configurations, and/or additional components:

A further embodiment of the foregoing PCM cell, wherein: the first width is less than half of the second width; and the second thickness is less than half of the first thickness.

A further embodiment of any of the foregoing PCM cells, wherein the first thickness is between 20 nanometers (nm) and 100 nm and the second thickness is between 0.2 nm and 10 nm.

A further embodiment of any of the foregoing PCM cells, wherein the first width is between 20 nm and 60 nm and the second width is between 100 nm and 300 nm.

A further embodiment of any of the foregoing PCM cells, wherein: the second phase change layer is in contact with the first electrode; and the first phase change material and the second phase change material are the same and consist essentially of germanium, antimony, and tellurium.

A PCM cell, according to an exemplary embodiment of this disclosure, among other possible things, includes: a first electrode comprised of a first electrically conductive material; a second electrode comprised of a second electrically conductive material; an insulator comprised of an electrically insulating material positioned between the first and second electrodes; a first phase change layer positioned alongside the first and second electrodes and the insulator, the first phase change layer being comprised of a mixture of a first phase change material and a dopant material, and the first phase change layer having a first thickness; and a second phase change layer in contact with the first phase change layer and in an electrical path between the first and second electrodes, the second phase change layer consisting essentially of a second phase change material and having a second thickness; wherein the second thickness is less than half of the first thickness.

The PCM cell of the preceding paragraph can optionally include, additionally and/or alternatively, any one or more of the following features, configurations, and/or additional components:

A further embodiment of the foregoing PCM cell, wherein the first thickness is between 20 nanometers (nm) and 100 nm and the second thickness is between 0.2 nm and 10 nm.

A further embodiment of any of the foregoing PCM cells, wherein the first thickness is between 40 nm and 80 nm and the second thickness is between 0.5 nm and 5 nm.

A further embodiment of any of the foregoing PCM cells, wherein: the second phase change layer comprises a first portion that is separated from the second portion; the first portion is in contact with and extends along the first electrode; the second portion is in contact with and extends along the second electrode; and the first phase change layer is in contact with and extends along the first portion, the insulator, and the second portion.

A further embodiment of any of the foregoing PCM cells, further comprising: a projection liner in contact with and extending along the first electrode, the insulator, and the second electrode, the projection liner comprised of a material selected from a group consisting of: a metal material and a semiconductor material; wherein the second phase change layer is in contact with and extends along an entirety of the projection liner; and wherein the first phase change layer is in contact with and extends along an entirety of the second phase change layer.

A PCM cell, according to an exemplary embodiment of this disclosure, among other possible things, includes: a first electrode; a second electrode; a pillar comprised of a mixture of a first phase change material and a dopant material, and the pillar having a first height; an insulator to surround the pillar, the insulator comprising an electrically insulating material; and a layer consisting essentially of a second phase change material, the layer being in contact with the pillar and extending along an entirety of a side of the pillar, the layer being in contact with at least one of the first and second electrodes, and the layer having a second height, wherein the second height is less than half of the first height.

The PCM cell of the preceding paragraph can optionally include, additionally and/or alternatively, any one or more of the following features, configurations, and/or additional components:

A further embodiment of the foregoing PCM cell, wherein the first height is between 20 nanometers (nm) and 100 nm, and the second height is between 0.2 nm and 10 nm.

A further embodiment of any of the foregoing PCM cells, wherein the layer is in contact with the first and second electrodes.

A further embodiment of any of the foregoing PCM cells, further comprising: a selector connected to the first electrode, the selector comprising an ovonic threshold switch.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change memory (PCM) cell comprising:
   a first electrode comprised of a first electrically conductive material;
   a second electrode comprised of a second electrically conductive material;
   a first phase change layer positioned between the first electrode and the second electrode and being comprised of a first phase change material having a first resistivity;
   a second phase change layer positioned between the first electrode and the second electrode and being comprised of a second phase change material having a second resistivity; and
   a third phase change layer in contact with the first phase change layer and the second electrode, the third phase change layer comprised of a third phase change material having a third resistivity;
   wherein the first resistivity is at least two times the second resistivity and is at least two times the third resistivity.

2. The PCM cell of claim 1, wherein the third phase change layer further comprises a dopant material.

3. The PCM cell of claim 1, wherein the first phase change layer further comprises a dopant material.

4. The PCM cell of claim 3, wherein the second phase change layer is composed of the second phase change material.

5. The PCM cell of claim 1, wherein the second phase change layer is in contact with the first electrode and the second electrode.

6. The PCM cell of claim 1, further comprising:
   a projection liner positioned between the first electrode and the second electrode and being comprised of a semiconducting material.

7. The PCM cell of claim 6, wherein the projection liner is in contact with the first electrode and the second phase change layer.

8. A phase change memory (PCM) cell comprising:
   a first electrode comprised of a first electrically conductive material;
   a second electrode comprised of a second electrically conductive material;
   a first phase change layer positioned between the first electrode and the second electrode, the first phase change layer being comprised of a first phase change material; and
   a second phase change layer positioned between the first electrode and the second electrode, the second phase change layer being comprised of a second phase change material;
   wherein the second phase change layer is in contact with the first electrode and the second electrode.

9. The PCM cell of claim 8, wherein the first phase change layer has a first thickness and the second phase change layer has a second thickness, the PCM cell further comprising:
   a third phase change layer in contact with the first phase change layer and the second electrode, the third phase change layer having a third thickness and being comprised of a third phase change material;
   wherein the third thickness is less than one-quarter of the first thickness.

10. The PCM cell of claim 8, wherein the third phase change layer further comprises a dopant material.

11. The PCM cell of claim 8, wherein the first phase change layer further comprises a dopant material.

12. The PCM cell of claim 11, wherein the second phase change layer is composed essentially of the second phase change material that is undoped.

13. The PCM cell of claim 8, wherein:
   the first phase change layer has a first resistivity;
   the second phase change layer has a second resistivity; and
   the first resistivity is at least two times the second resistivity.

14. The PCM cell of claim 8, further comprising a projection liner positioned between the first electrode and the second electrode and being comprised of a semiconducting material wherein the projection liner is in contact with the first electrode and the second phase change layer.

15. A phase change memory (PCM) cell comprising:
   a first electrode comprised of a first electrically conductive material;
   a second electrode comprised of a second electrically conductive material;
   a first phase change layer positioned between the first electrode and the second electrode, the first phase change layer having a first thickness and being comprised of a first phase change material;
   a second phase change layer positioned between the first electrode and the second electrode, the second phase change layer having a second thickness and being comprised of a second phase change material; and a projection liner positioned between the first electrode and the second electrode and being comprised of a semiconducting material.

16. The PCM cell of claim 15, wherein the first phase change layer has a first thickness and the second phase change layer has a second thickness, the PCM cell further comprising:

a third phase change layer in contact with the first phase change layer and the second electrode, the third phase change layer having a third thickness and being comprised of a third phase change material;

wherein the third thickness is less than one-quarter of the first thickness.

17. The PCM cell of claim 15, wherein the third phase change layer further comprises a dopant material.

18. The PCM cell of claim 15, wherein:

the first phase change layer further comprises a dopant material; and the second phase change layer is composed essentially of the second phase change material that is undoped.

19. The PCM cell of claim 15, wherein:

the first phase change layer has a first resistivity;

the second phase change layer has a second resistivity; and the first resistivity is at least two times the second resistivity.

20. The PCM cell of claim 15, wherein the projection liner is in contact with the first electrode and the second phase change layer.

* * * * *